United States Patent [19]

Moberg

[11] Patent Number: 4,496,939
[45] Date of Patent: Jan. 29, 1985

[54] POWER INDICATOR APPARATUS FOR A DC TO DC FLYBACK CONVERTER

[75] Inventor: Gregory O. Moberg, Rochester, N.Y.

[73] Assignee: Eastman Kodak Company, Rochester, N.Y.

[21] Appl. No.: 384,858

[22] Filed: Jun. 4, 1982

[51] Int. Cl.³ .............................................. G08B 21/00
[52] U.S. Cl. .................................... 340/636; 315/135; 315/241 P; 363/19
[58] Field of Search .......................... 340/636; 363/19; 315/241 P, 135; 320/48

[56] References Cited

U.S. PATENT DOCUMENTS

| | | |
|---|---|---|
| 4,068,150 | 1/1978 | Iwata et al. .................. 315/241 P |
| 4,197,484 | 4/1980 | Tanaka .......................... 315/241 P |
| 4,258,290 | 3/1981 | Nakajima .................... 315/241 P X |
| 4,258,297 | 3/1981 | Nakajima ...................... 315/241 P |

Primary Examiner—James L. Rowland
Assistant Examiner—Daniel Myer
Attorney, Agent, or Firm—Dennis P. Monteith

[57] ABSTRACT

A battery power indicator for a DC to DC flyback converter is responsive to the current flowing in the secondary winding of the converter's transformer. In one embodiment the power indicator is lighted when the battery is weak but not dead. If the battery is good, the indicator is bypassed and remains off. In a second embodiment, the indicator is lighted to indicate a good battery and when the power capability of the battery drops below a predetermined level, the indicator turns off.

13 Claims, 4 Drawing Figures

POWER INDICATOR APPARATUS FOR A DC TO DC FLYBACK CONVERTER

FIELD OF THE INVENTION

This invention relates generally to power indicator apparatus. More particularly, the invention relates to apparatus for indicating the status of a power source arranged to energize a DC to DC flyback converter.

DESCRIPTION OF THE PRIOR ART

A DC to DC flyback converter includes a transformer which stores energy when current is supplied to the transformer from a power source. A current sensing circuit interrupts the current when it reaches a predetermined magnitude and the transformer then delivers its stored energy to a load, such as the main discharge capacitor of an electronic strobe flash unit. When all or a predetermined portion of the energy stored in the transformer has been delivered to the load, current from the power source is again applied to the transformer and the cycle is repeated.

When a DC to DC flyback converter is used to charge the main discharge capacitor of an electronic strobe flash unit from a low voltage battery, it is desirable to indicate to the user when such battery has insufficient power to charge the capacitor within a predetermined maximum time period. U.S. Pat. No. 4,197,484 discloses an electronic strobe flash unit including a DC to DC converter which converts a low voltage DC power source to a high voltage DC current for charging the main discharge capacitor of the flash unit. The DC to DC converter includes an oscillation transformer having a primary winding, a secondary winding, a first auxiliary winding, a second auxiliary winding, an auxiliary capacitor and a display circuit which is lit when the voltage generated across the second auxiliary winding and the voltage applied across the auxiliary capacitor are superposed to reach a predetermined value.

A display circuit, such as that of the U.S. Pat. No. 4,197,484, which indicates when the voltage across the discharge capacitor reaches a predetermined threshold, is not a reliable indicator of battery power capability. For example, if a sufficient residual charge remains on the discharge capacitor, the display circuit may be lit shortly after the strobe flash unit is turned on, even though the battery is weak and should be changed.

SUMMARY OF THE INVENTION

The present invention uses a property of a flyback converter, viz. that its secondary current consists of a series of triangular current pulses of decreasing width whose peak amplitude is a function of the power delivered to the load, to provide a simple and inexpensive yet thoroughly reliable indication of the ability of the battery to provide a predetermined minimum power to the converter.

In one preferred embodiment of the invention, a battery power indicator for a DC to DC flyback converter comprises a light emitting diode (LED) and a resistor connected in series to the secondary winding of the converter's transformer and a semiconductor element connected in parallel with the LED. The semiconductor element, which may be either a silicon controlled rectifier (SCR) or a pair of discrete, complimentary, high gain transistors, is turned ON when the peak current in the secondary winding is above a preselected threshold. When the semiconductor is turned ON, the secondary winding current bypasses the LED and the LED remains OFF. However, when the battery power supplied to the converter falls below a predetermined minimum level, the peak current in the secondary winding falls below the preselected threshold and the semiconductor element remains OFF. When the semiconductor element is OFF, the secondary winding current flows through the LED and the LED turns ON. In this way, during the time the battery is weak, but not dead, the LED will light when the converter is operating, indicating to the user that it is time to replace the battery.

In a second preferred embodiment of the invention a battery powered indicator for a DC to DC flyback converter comprises an LED connected in series to the secondary winding of the converter's transformer and a resistor connected in parallel with the LED. In this embodiment, when the peak current in the secondary winding is above a preselected threshold, the current flow through the LED is sufficient to turn the LED ON indicating a "good" battery. Extinguishment of the LED subsequent to its turning ON, provides a visual indication to the strobe unit user that the strobe unit's flashtube is ready to fire, without draining the battery. However, when the power capability of the battery falls below a predetermined minimum level, the peak current in the secondary winding falls below the preselected threshold necessary to turn the LED ON and the LED remains OFF. Thus in this second embodiment, the failure of the LED to light when the strobe unit is turned ON, indicates to the user that it is time to replace the battery.

The invention and its features and advantages will become more apparent by referring to the accompanying drawings and to the ensuing detailed description of the preferred embodiments of the invention.

DETAILED DESCRIPTION OF THE PREFERRED EMBODIMENTS

Because battery powered DC to DC flyback converters are well known, the present description will be directed in particular to elements forming part of, or cooperating directly with, apparatus in accordance with the present invention. It is to be understood that elements not specifically shown or described may take various forms well known to those having skill in the converter art.

Figure 1:
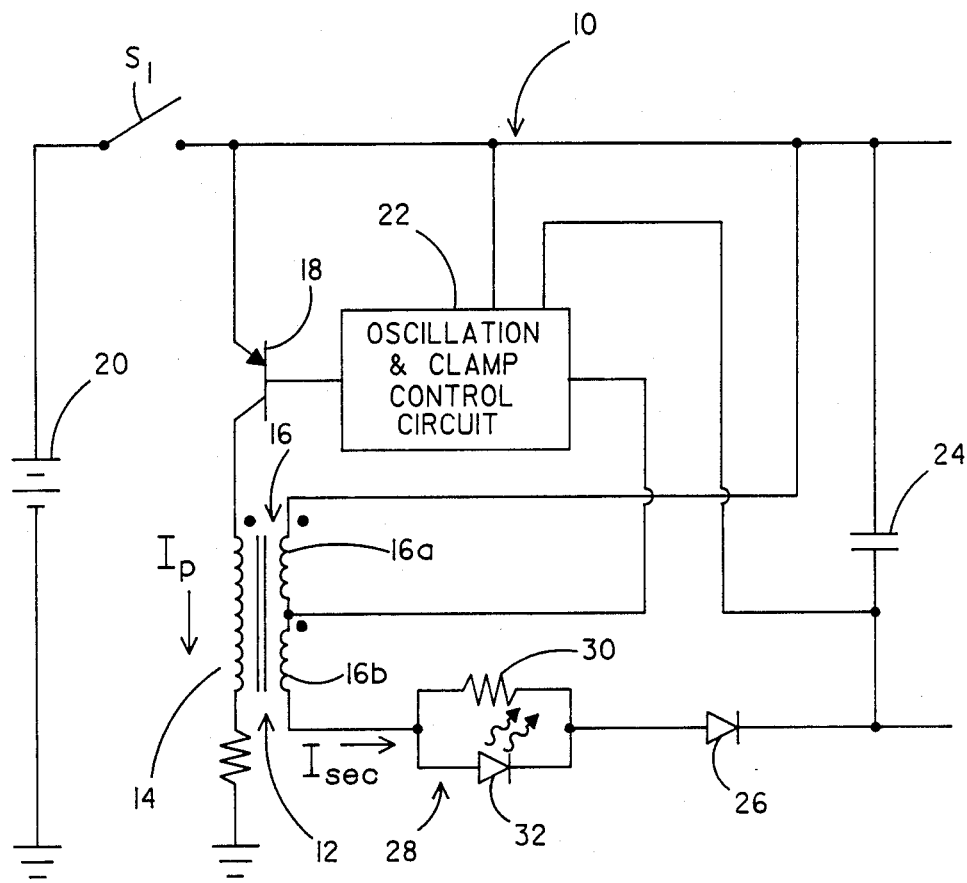
FIG. 1 is a schematic circuit diagram of a battery powered DC to DC flyback converter having a power indicator constructed in accordance with the invention.

FIG. 1 shows a DC to DC converter 10 of the type known in the art either as a flyback converter or a ringing choke converter. The converter 10 includes a transformer 12 having like wound primary and secondary windings 14 and 16, respectively. A PNP oscillating power transistor 18 has its emitter electrode connected to a switch $S_1$, which is serially connected to a low-voltage battery 20, and its collector electrode connected in series to the primary winding 14. An oscillation and clamp control circuit 22, which is connected to a central tap of the secondary winding 16, the base electrode of the transistor 18, and the positive end of a high-voltage, flash discharge capacitor 24, provides oscillation turn ON and turn OFF and final clamp OFF control to the transistor 18. Oscillation and clamp control circuits for DC to DC converters are well known to those having skill in the art. Illustrative oscillation control and clamp control circuits are disclosed in commonly assigned co-pending U.S. patent application Ser. No. 341,948, filed Jan. 19, 1982 entitled STORED CHARGE COMMUTATION OF A FLYBACK OSCILLATING TRANSISTOR, the disclosure of which is incorporated herein by reference. A diode 26 is connected in series to the secondary winding 16 for conducting a rectified charging current to charge the capacitor 24.

Also connected in series to the secondary winding 16 is a battery power indicator 28 comprising the parallel combination of a resistor 30 and a light emitting diode (LED) 32. The power indicator 28 operates to provide a "good" battery signal in the manner explained in detail hereinbelow. The term "good" battery as used herein denotes the ability of the flyback converter 10 to extract at least a predetermined minimum power from the battery 20.

Briefly described, the flyback converter 10 operates as follows. With the switch $S_1$ closed, the transistor 18 is initially turned ON via a current sink, which is part of the control circuit 22, connected to the base of the transistor 18. When the transistor 18 conducts, a current $I_p$ flows from the battery 20 through the primary winding 14 and the transistor 18, which is quickly driven into saturation. When this occurs, the current $I_p$ increases exponentially with time towards the battery short circuit current. When battery current flows in the primary winding 14 so that a voltage is developed across this winding, the polarity of the voltage induced across the secondary winding 16 is such that the diode 26 is biased in the reverse direction. Therefore, when the current $I_p$ flows in the primary winding 14 there is no current in the secondary winding 16. As the current $I_p$ rises, the voltage across the primary winding 14 falls and a feedback voltage developed across a control portion 16a of the secondary winding 16 falls in proportion to the turns ratio of the primary winding 14 and the control portion 16a of the secondary winding 16.

When the feedback voltage reaches a level where the base current of the transistor 18 is insufficient to maintain the transistor in the conducting state, the oscillating control and clamp circuit 22 provides a turn-OFF pulse to the base of the transistor 18 which rapidly drives the transistor into cutoff. When the transistor 18 is turned OFF, the magnetic field stored in the core of the transformer 12 collapses, thus causing voltages of opposite polarity to be induced in the windings 14 and 16. When the voltage across portion 16b of the secondary winding 16 reaches a level so that the diode 26 is forwardly biased, a current $I_s$ begins to flow in the secondary winding 16 and charges the capacitor 24.

Figure 2:
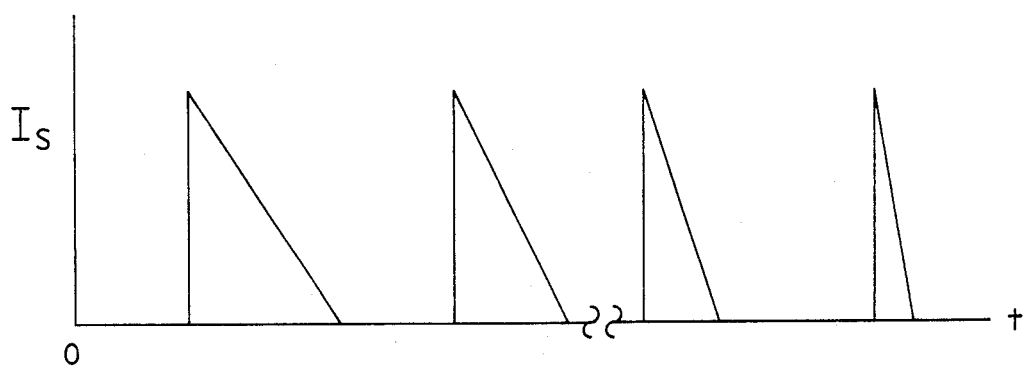
FIG. 2 illustrates the current flowing in the secondary winding of the flyback converter of FIG. 1.

As shown in FIG. 2, when the current $I_s$ starts to flow, it has a peak or maximum value. That value is proportional to the primary to secondary turns ratio of the transformer 12, multiplied by the value of $I_p$ when the transistor 18 turns OFF. The current $I_s$ decreases exponentially with time. When the energy stored in the transformer 12 has been transferred to the capacitor 24, the voltages across all the windings of the transformer begin to collapse toward zero. When the diode 26 is no longer forwardly biased, $I_s$ terminates. The oscillating control and clamp circuit 22 then provides a turn ON pulse to the base of the transistor 18 and the cycle is repeated. As the capacitor 24 charges up to the desired voltage level, the duty cycle of the transformer secondary 16 is reduced, as shown in FIG. 2. When the capacitor 24 reaches the desired voltage level, the oscillating control and clamp circuit 22 clamps off the transistor 18 and stops the converter 10.

From the foregoing discussion it can be seen that the secondary current $I_s$ consists of a series of nearly triangular current pulses of decreasing width whose peak amplitude is a function of the power delivered to the capacitor 24. It is this property of the secondary current that is exploited by the power indicator 28 to provide a "good" battery signal. The LED 32 will light when approximately 1.5 volts are developed across it. By properly selecting the size of the resistor 30, only peak secondary currents above a preselected threshold will provide more than 1.5 volts across the resistor 30, and, thus, the LED 32, for causing it to light. The LED 32 is, of course, turning ON and OFF during the operation of the converter 10 as the secondary current $I_s$ flows and then terminates. However, since the converter 10 operates at kilohertz frequencies, the LED 32 appears to be ON continuously during converter operation. When the capacitor 24 is charged to the desired level and the oscillation and clamp control circuit 22 turns OFF the converter 10, the LED 32 is extinguished. Advantageously, this turning OFF of the LED 32 provides a visual indication to the strobe unit operator that the strobe unit's flashtube is ready to fire, without additional drain of the battery power. However, when the power capability of the battery 20 drops below the predetermined level, the peak secondary current is insufficient to provide the 1.5 volts necessary to turn the LED ON. Thus, the failure of the LED 32 to light when the converter 10 is turned ON, indicates to the user that it is time to change the battery 20.

Figure 3:
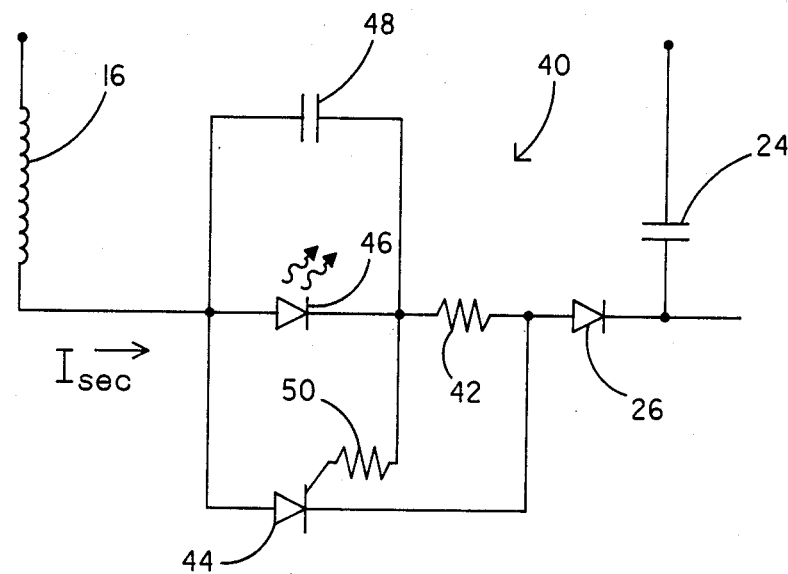
FIG. 3 is a schematic circuit diagram of another embodiment of a power indicator for a battery powered DC to DC flyback converter.
Figure 4:
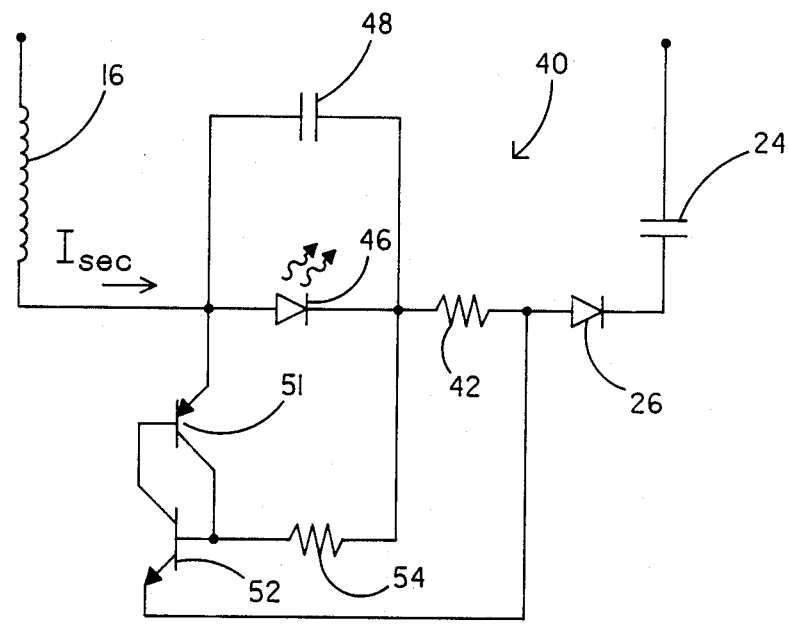
FIG. 4 is a schematic circuit diagram of still another embodiment of a power indicator for battery powered DC to DC flyback converter.

The power indicators shown in FIGS. 3 and 4 provide a "weak" battery signal for a DC to DC flyback converter such as that illustrated in FIG. 1. The term "weak" battery signal as used herein denotes the inability of the flyback converter to extract a predetermined minimum power from the battery.

The power indicator 40 shown in FIG. 3 operates as follows. The size of a resistor 42 is selected such that when the power capability of the battery 20 is above a predetermined minimum level, the gate-to-cathode voltage V of silicon controlled rectifier (SCR) 44 ($V = I_{s\,max} \times R_{42}$) is greater than approximately 0.7 volt, and the SCR 44 fires. This causes the secondary current $I_s$ to bypass LED 46, which turns the LED 46 OFF. However, when the power capability of the battery drops below a predetermined minimum level, the voltage V across the resistor 42, and, thus, the gate-to-cathode of the SCR 44, is less than 0.7 volt, and the SCR 44 will not fire. When the SCR 44 does not fire, the secondary current $I_s$ flows through the LED 46 and turns the LED ON. Again, the LED 46 turns ON and OFF during the operation of the converter as the secondary current cyclically flows and then terminates, but to the user appears to be ON continuously due to the high operating frequency of the converter. In this way, during the time the battery is weak, but not dead, the LED 46 will light when the converter is operating. A capacitor 48 serves to briefly bypass current around the LED 46 when current $I_s$ commences to flow during each operating cycle, to make sure that the LED 46 remains OFF when the battery power is above the predetermined battery level. A second resistor 50 is connected to the gate electrode of the SCR 44 and operates to allow the SCR to remain ON once it is fired.

If the turn-on time of the SCR 44 is excessive, which could cause the LED 46 to turn ON, the SCR can be replaced by a pair of discrete, complimentary, high gain (fast) transistors 51 and 52, respectively, as shown in FIG. 4. In this embodiment, when the battery power is above the predetermined minimum level the transistors 51 and 52, which have a primary current conducting path connected in parallel with the series connection of the LED 46 and resistor 42, conduct and the LED 46 remains OFF. When the battery power is below the predetermined minimum level the transistors 51 and 52 do not conduct and the LED 46 turns ON. A second resistor 54 is connected to the collector of the transistor 51 and to the base of transistor 52 and operates in a similar capacity to the resistor 50 of FIG. 3, i.e. to allow the continued conduction of transistor 52 after initial turn ON.

The invention has been described in detail with particular reference to preferred embodiments thereof, but it will be understood that variations and modifications can be affected within the spirit and scope of the invention.

I claim:

1. In a battery power indicator apparatus for a DC to DC flyback converter having an input energizable by a battery and an output connectable for supplying to a load an amount of energy that is functionally related to the power-delivery capability of the battery, the improvement comprising:

current-sensitive means connected in parallel with voltage-sensitive indicator means, the combination of said current-sensitive means and said indicator means being serially connected between the output of the converter and its load for passage of a pulsed output current from the DC to DC converter to the load during an energy transfer phase of the converter, said current-sensitive means being adapted to produce a control voltage that is functionally related to the output current and that causes said indicator means (1) to indicate acceptable battery power for operating the DC to DC converter when the amplitude of the output current is above a preselected level, and (2) to indicate unacceptable battery power when the amplitude of the current is below the preselected level.

2. Battery power indicator apparatus as defined in claim 1 wherein said current-sensitive means includes resistive means across which the control voltage is developed, and wherein the control voltage serves as an operating voltage for controlling the operation of said indicator means.

3. Power indicator apparatus for a DC to DC flyback converter arranged to be energized by a storage battery, the converter including a transformer having a primary winding through which current supplied by the battery flows and a secondary winding, said power indicator apparatus comprising:

an illumination source connected in series to the secondary winding of the transformer, said illumination source having a first condition for indicating an acceptable power capability of the battery and a second condition for indicating a nonacceptable power capability of the battery; and a resistor connected in parallel with said illumination source, the magnitude of said resistor being such that (a) for a current in the secondary winding above a preselected threshold said illumination source is placed in its first condition, and (b) for a current in the secondary winding below said preselected threshold said illumination source is placed in its second condition.

4. Power indicator apparatus according to claim 3 wherein said illumination source comprises a light emitting diode.

5. Power indicator apparatus for DC to DC flyback converter arranged to be energized by a storage battery, the converter including a transformer having a primary winding through which current supplied by the battery flows and a secondary winding, said power indicator apparatus comprising:

an illumination source and a resistor connected in series to the secondary winding of the transformer, said illumination source having a first condition for indicating an acceptable power capability of the battery and a second condition for indicating a nonacceptable power capability of the battery, and a semiconductor element having a primary current conducting path connected in parallel with the series connection of said illumination source and said resistor, said semiconductor element being in a conductive state when the peak current in the secondary winding is above a preselected threshold and being in a nonconductive state when the peak current in the secondary winding is below said preselected threshold, said semiconductor element in its conductive state placing said illumination source in its first condition and, in its non-conductive state, placing said illumination source in its second condition.

6. Power indicator apparatus according to claim 5 wherein said semiconductor element comprises a silicon controlled rectifier.

7. Power indicating apparatus according to claim 6 further comprising a second resistor connected in series to the gate electrode of said silicon controlled rectifier.

8. Power indicating apparatus according to claim 5 wherein said semiconductor element comprises first and second discrete, complimentary, high gain transistors.

9. Power indicator apparatus according to claim 8 further comprising a second resistor connected to the collector of said first transistor and to the base of said second transistor.

10. Power indicator apparatus according to claim 5 wherein said illumination source comprises a light emitting diode.

11. Power indicator apparatus according to claim 10 further comprising a capacitor connected in parallel with said light emitting diode.

12. Power indicator apparatus according to claim 11 further comprising a capacitor connected in parallel with said light emitting diode.

13. In a DC to DC converter which includes an oscillation transformer having a primary winding through which current supplied by the battery flows and a secondary winding through which a high voltage current flows for charging a capacitor, the improvement comprising;

control means for starting the oscillation transformer to initiate charging of the capacitor and for stopping the oscillation transformer when the voltage across the discharge capacitor reaches a predetermined level;

indicator means connected in series to the secondary winding of the transformer, said indicator means having a first state and a second state; and a resistor connected in parallel with said indicator means, the magnitude of said resistor being such that (a) for a current in the secondary winding above a preselected threshold said indicator means is placed in its first state, and (b) for a current in the secondary winding below said preselected threshold said indicator means is placed in its second state, the placement of said indicator means in its first state when the oscillation transformer is started indicating an acceptable power capability of the battery and the subsequent placement of said indicator means in its second state when the oscillation transformer is stopped indicating that the capacitor has been charged to the predetermined voltage level, and the placement of said indicator means in its second state when the oscillation transformer is started indicating a non-acceptable power capability of the battery.

* * * * *